United States Patent
Wada

(10) Patent No.: US 10,749,519 B2
(45) Date of Patent: Aug. 18, 2020

(54) SEMICONDUCTOR DEVICE DRIVING METHOD AND DRIVING APPARATUS AND POWER CONVERSION APPARATUS

(71) Applicant: Mitsubishi Electric Corporation, Chiyoda-ku (JP)

(72) Inventor: Yukihiko Wada, Chiyoda-ku (JP)

(73) Assignee: MITUSHIBHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/494,545

(22) PCT Filed: Dec. 19, 2017

(86) PCT No.: PCT/JP2017/045499
§ 371 (c)(1),
(2) Date: Sep. 16, 2019

(87) PCT Pub. No.: WO2018/198426
PCT Pub. Date: Nov. 1, 2018

(65) Prior Publication Data
US 2020/0052686 A1    Feb. 13, 2020

(30) Foreign Application Priority Data
Apr. 26, 2017  (JP) ................. 2017-087214

(51) Int. Cl.
*H03K 17/16*     (2006.01)
*H03K 17/0412*   (2006.01)
(Continued)

(52) U.S. Cl.
CPC ..... *H03K 17/161* (2013.01); *H03K 17/04123* (2013.01); *H03K 17/163* (2013.01);
(Continued)

(58) Field of Classification Search
CPC ........ H02M 1/12; H02M 1/14; H03K 17/161; H03K 17/302; H03K 17/163;
(Continued)

(56) References Cited

U.S. PATENT DOCUMENTS 7,839,185 B2 * 11/2010 Schwarzer ........... H03K 17/567
326/82
9,979,292 B2 * 5/2018 Zhang ..................... H02M 1/36
(Continued)

FOREIGN PATENT DOCUMENTS

JP    2001-45742 A    2/2001
JP    2008-66929 A    3/2008
(Continued)

OTHER PUBLICATIONS

International Search Report dated Mar. 20, 2018 in PCT/JP2017/045499 filed on Dec. 19, 2017.

*Primary Examiner* — Thomas J. Hiltunen
(74) *Attorney, Agent, or Firm* — Xsensus LLP

(57) ABSTRACT

Turn-on and turn-off of a semiconductor device are controlled through control of a gate voltage in accordance with a driving control signal. At a first time after a start of a Miller period of a gate voltage in driving a gate of the semiconductor device in accordance with the driving control signal, a driving signal is changed from "1" to "0" to thereby make a gate driving ability temporarily lower than the gate driving ability during a period from a starting time of the turn-on operation to the first time. Further, at a second time corresponding to an end of the Miller period, the driving signal is changed from "0" to "1" to thereby increase the gate driving ability.

15 Claims, 9 Drawing Sheets

(51) Int. Cl.
*H03K 17/30* (2006.01)
*H02M 1/00* (2006.01)

(52) U.S. Cl.
CPC ... *H03K 17/302* (2013.01); *H02M 2001/0029* (2013.01); *H02M 2001/0054* (2013.01)

(58) Field of Classification Search
CPC .. H03K 17/04123; H03K 17/56; H03K 17/16; H03K 17/48
See application file for complete search history.

(56) References Cited

U.S. PATENT DOCUMENTS

| | | | |
|---|---|---|---|
| 10,382,032 B2* | 8/2019 | Mukhopadhyay | H02M 1/08 |
| 10,451,669 B2* | 10/2019 | Marques Martins | H01L 29/7848 |
| 2010/0176783 A1 | 7/2010 | Tagome | |
| 2013/0222042 A1 | 8/2013 | Kikuchi et al. | |
| 2015/0236686 A1* | 8/2015 | Senda | H03K 17/0828 327/381 |
| 2018/0062633 A1* | 3/2018 | Nomura | H03K 17/163 |
| 2019/0310675 A1* | 10/2019 | Araragi | H02M 7/53875 |

FOREIGN PATENT DOCUMENTS

| | | |
|---|---|---|
| JP | 2010-119184 A | 5/2010 |
| JP | 2012-147492 A | 8/2012 |
| JP | 2013-179390 A | 9/2013 |

\* cited by examiner

SEMICONDUCTOR DEVICE DRIVING METHOD AND DRIVING APPARATUS AND POWER CONVERSION APPARATUS

TECHNICAL FIELD

The present invention relates to a semiconductor device driving method and a semiconductor device driving apparatus, as well as a power conversion apparatus, and more specifically relates to a technique for turning on and off a voltage-driven-type semiconductor device.

BACKGROUND ART

For a switching operation of a voltage-driven-type semiconductor device of which typical examples are MOS-FET (Metal-Oxide-Semiconductor Field-Effect Transistor) and IGBT (Insulated Gate Bipolar Transistor), a driving apparatus is applied for charging and discharging the gate of the semiconductor device in response to an on/off control signal.

It is known that there is a trade-off relation, in such a switching operation, between the magnitude of power loss of the semiconductor device (so-called switching loss) and the magnitude of electromagnetic noise generated by the semiconductor device. Specifically, increase of the gate charging/discharging speed for the purpose of reducing the switching loss results in increase of the electromagnetic noise, while decrease of the gate charging/discharging speed for the purpose of reducing the electromagnetic noise results in increase of the switching loss.

It is desired for a semiconductor device driving apparatus to improve this trade-off and drive the semiconductor device with reduced loss and reduced noise.

Japanese Patent Laying-Open No. 2012-147492 (PTL 1) discloses that in turning on a semiconductor device, the output voltage of a driving apparatus for charging the gate is set lower during a period after a predetermined timing in a Miller period of the gate voltage, than the output voltage during a period before the predetermined timing.

Japanese Patent Laying-Open No. 2013-179390 (PTL 2) discloses that a charge pump circuit is used to charge the gate of a semiconductor device, and discloses a manner of control in which a capacitor of the charge pump circuit is discharged at a predetermined timing prior to the end of a Miller period of the gate voltage in turning off the semiconductor device, to thereby reduce the gate discharging speed after the predetermined timing.

CITATION LIST

Patent Literature

PTL 1: Japanese Patent Laying-Open No. 2012-147492
PTL 2: Japanese Patent Laying-Open No. 2013-179390

SUMMARY OF INVENTION

Technical Problem

PTL 1 and PTL 2 each disclose that, after a predetermined timing in a Miller period included in the latter half of a semiconductor device switching operation, the gate charging/discharging speed is set lower, i.e., driving ability for the semiconductor device is set lower, to thereby reduce electromagnetic noise.

According to PTL 1 and PTL 2, driving ability for the semiconductor device is kept low from the time when the driving ability is set lower to the completion of switching (ON or OFF) of the semiconductor device. Accordingly, the time required for switching the semiconductor device increases, which may increase the switching loss. As a result, the trade-off between the switching loss and the electromagnetic noise may not be improved sufficiently.

Moreover, while the electromagnetic noise generated from the turn-on operation is usually larger than the electromagnetic noise generated from the turn-off operation, PTL 2 cannot reduce the electromagnetic noise generated from the turn-on operation.

The present invention has been made to solve the above-described problem, and an object of the present invention is to reduce the electromagnetic noise without increasing the power loss in a switching operation of a semiconductor device.

Solution to Problem

According to an aspect of the present invention, a semiconductor device driving method for turning on and off a semiconductor device in accordance with a driving control signal includes: at a first time point after a start of a Miller period of a gate voltage in driving a gate of the semiconductor device in accordance with the driving control signal, making a driving ability lower than the driving ability during a first period from a start of driving the gate to the first time point; and at a second time point corresponding to an end of the Miller period, making the driving ability higher than the driving ability during a second period from the first time point to the second time point in the Miller period.

According to another aspect of the present invention, a semiconductor device driving apparatus for turning on and off a semiconductor device includes a driving circuit and an adjusting unit configured to adjust a driving ability of the driving circuit. The driving circuit is configured to drive a gate of the semiconductor device in accordance with a driving control signal controlling turn-on and turn-off of the semiconductor device. The adjusting unit is configured to make, at a first time point after a start of a Miller period of a gate voltage in driving the gate by the driving circuit in accordance with the driving control signal, the driving ability for the gate lower than the driving ability during a first period from a start of driving the gate to the first time point, and make, at a second time point corresponding to an end of the Miller period, the driving ability higher than the driving ability during a second period from the first time point to the second time point in the Miller period.

Advantageous Effects of Invention

The present invention enables reduction of the electromagnetic noise without increasing the power loss in a switching operation of a semiconductor device.

DESCRIPTION OF EMBODIMENTS

First Embodiment

Figure 1:
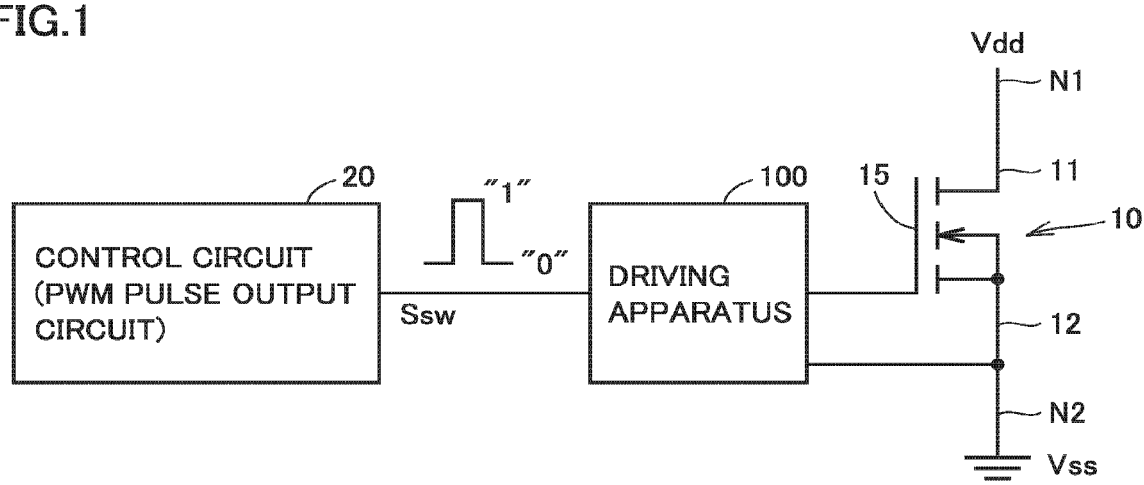
FIG. 1 is a block diagram for illustrating a function of a driving apparatus according to the present embodiment.

FIG. 1 is a block diagram for illustrating a function of a driving apparatus according to the present embodiment.

In accordance with driving control signal Ssw from a control circuit 20, a driving apparatus 100 controls turn-on and turn-off, i.e., switching operation, of a semiconductor device 10 connected between a high voltage terminal N1 and a low voltage terminal N2.

Semiconductor device 10 includes a drain 11 and a source 12 which are main electrodes, and a gate 15 which is a control electrode. The drain is connected to high-voltage terminal N1 and source 12 is connected to low-voltage terminal N2.

In accordance with a gate-source voltage (hereinafter also referred to simply as "gate voltage"), semiconductor device 10 is controlled into one of a connected state (ON state) in which current is generated between drain 11 and source 12, and an OFF state in which drain 11 and source 12 are disconnected from each other. Driving apparatus 100 controls the gate voltage so that semiconductor device 10 is turned on or off in accordance with driving control signal Ssw.

Driving control signal Ssw is set to "1" during a period in which semiconductor device 10 should be ON, and set to "0" during a period in which semiconductor device 10 should be OFF. In other words, the driving control signal is a binary signal which is either "1" corresponding to "first level" or "0" corresponding to "second level." Control circuit 20 may be configured as a PWM pulse output circuit for turning on and off semiconductor device 10 in accordance with the pulse width modulation (PWM) control.

Semiconductor device 10 is turned on when the gate voltage becomes a positive voltage higher than a predetermined threshold voltage. Therefore, driving apparatus 100 drives gate 15 so that the gate voltage is a positive voltage higher than the threshold voltage during a period in which driving control signal Ssw is "1." In contrast, driving apparatus 100 controls gate 15 so that the gate voltage is a voltage lower than or equal to the threshold voltage, or 0 or negative voltage, during a period in which driving control signal Ssw is "0."

As driving control signal Ssw changes from "0" to "1," driving apparatus 100 drives gate 15 so that the gate voltage increases, for performing a so-called turn-on operation of changing semiconductor device 10 from the OFF state to the ON state. Specifically, for turning on the semiconductor device, driving apparatus 100 charges gate 15.

In contrast, as driving control signal Ssw changes from "1" to "0," driving apparatus 100 drives gate 15 so that the gate voltage decreases, for performing a so-called turn-off operation of changing semiconductor device 10 from the ON state to the OFF state. Specifically, for turning off the semiconductor device, driving apparatus 100 discharges gate 15.

It is known that semiconductor device 10 consumes energy by itself in the switching operation, i.e., turn-on operation and turn-off operation, of semiconductor device 10. This energy consumption is hereinafter also referred to as switching loss. Switching loss is a cause of heat generation from semiconductor device 10. A smaller switching loss is therefore desired. It is also known that electromagnetic noise is generated depending on change, with time, of the voltage between the main electrodes, i.e., between the drain and the source of semiconductor device 10 in the switching operation. It is known that the electromagnetic noise is usually larger in the turn-on operation than in the turn-off operation.

Figure 2:
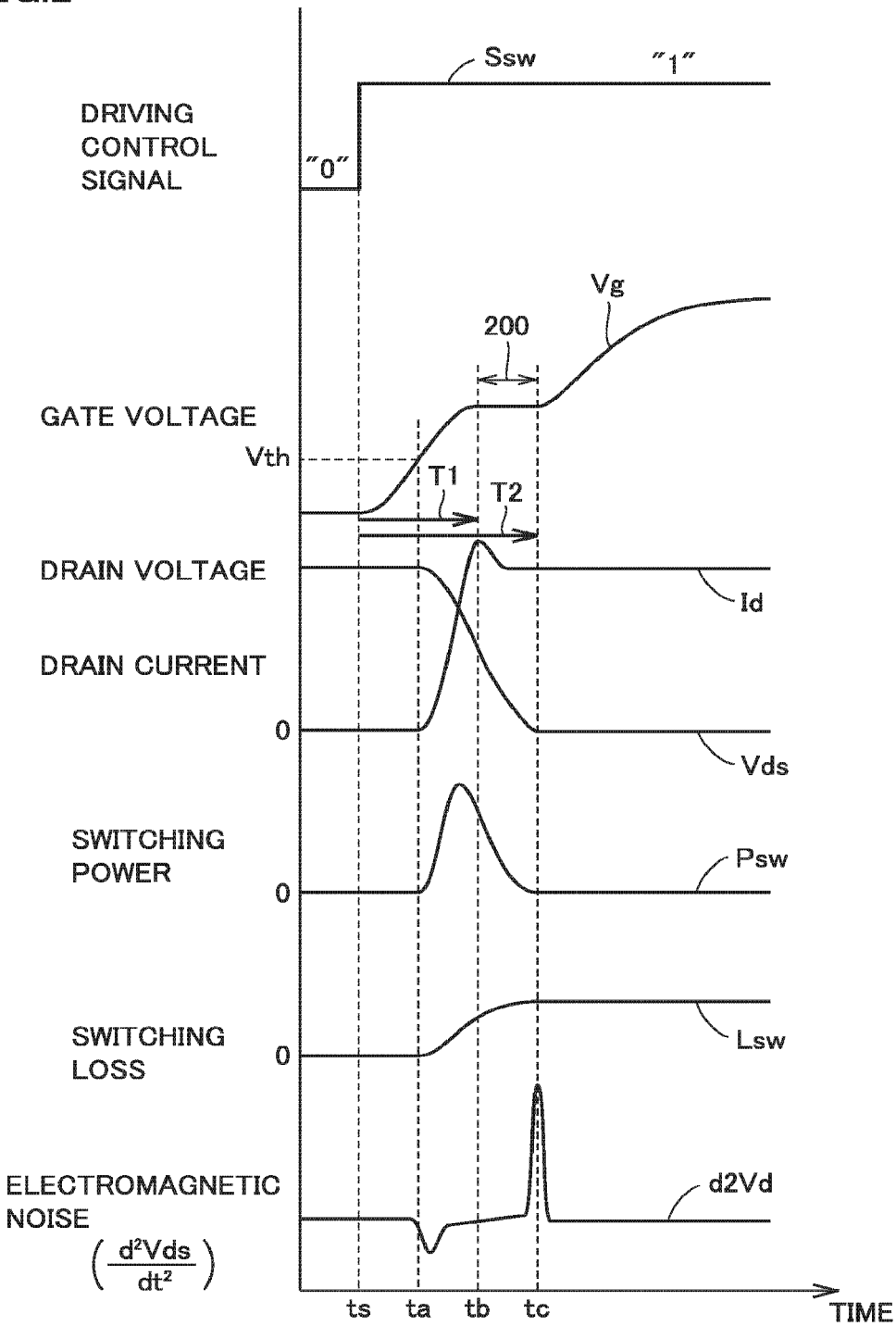
FIG. 2 is a waveform diagram for illustrating a general turn-on operation of a semiconductor device.

FIG. 2 is a waveform diagram for illustrating a general turn-on operation of a semiconductor device. Each voltage and each current in the following waveform diagrams such as FIG. 2 represent voltage and current measured from the outside of semiconductor device 10 through the gate terminal, the drain terminal, and the source terminal.

Referring to FIG. 2, before time ts, semiconductor device 10 is in the OFF state in which the main electrodes (drain and source) are disconnected from each other, drain-source voltage Vds (hereinafter also referred to simply as "drain voltage Vds") is (Vdd−Vss), and drain-source current Id (hereinafter also referred to simply as "drain current Id") is 0.

At time ts, driving control signal Ssw changes from "0" to "1" and, in response to this, driving apparatus 100 starts charging gate 15. Namely, the turn-on operation is started at time ts. For example, in the period of Ssw="1," gate 15 is connected to a power supply node that supplies predetermined positive voltage Vh. Accordingly, the gate voltage starts increasing at time ts.

At time ta, gate voltage Vg exceeds threshold voltage Vth and, in response to this, drain-source voltage Vds (hereinafter also referred to simply as "drain voltage Vds") starts decreasing and drain current Id starts increasing. After time ta, drain voltage Vds decreases gradually and drain current Id increases gradually, which causes semiconductor device 10 to become conductive gradually.

At this time, because each of drain current Id and drain voltage Vds has a finite value, semiconductor device 10 consumes switching power Psw corresponding to the product of them (Psw=Vds·Id). Before time ta (before turn-on), drain current Id is interrupted (Id=0) and the switching power is therefore Psw=0. After time ta, the switching power is Psw>0.

After time ts, as gate voltage Vg increases, a parasitic capacitance of gate 15 is charged. Therefore, even after the start of charging of gate 15 in response to the change of driving control signal Ssw, gate voltage Vg does not increase immediately but exhibits a voltage behavior as shown in FIG. 2.

It is known that the parasitic capacitance of gate 15 (gate capacitance) is not constant but has a dependency on drain voltage Vds. In particular, as drain voltage Vds decreases, a feedback capacitance which is a capacitance between the gate and the drain is added as a notional gate capacitance (so-called Miller capacitance), to the gate capacitance.

The aforementioned Miller capacitance has a dependency on the drain voltage. The Miller capacitance increases as drain voltage Vds decreases. When drain voltage Vds has decreased sufficiently, the Miller capacitance stops increasing and does not increase any more. Thus, change of the gate voltage is not a uniform change. Before the Miller capacitance stops increasing, the period from time tb to time tc is a period called Miller period 200 in which gate voltage Vg does not increase. Gate voltage Vg in Miller period 200 is also called "Miller voltage." The start time and the end time of the Miller period are therefore time tb and time tc, respectively.

In Miller period 200, drain voltage Vds still continues decreasing. At the same time as the end of Miller period 200, drain voltage Vds becomes substantially Vds=0. Therefore, at time tc when Miller period 200 ends, the main electrodes (drain and source) of semiconductor device 10 become electrically conductive and turn-on is completed. After the end of Miller period 200, gate voltage Vg increases continuously. When gate voltage Vg reaches a predetermined voltage (charging voltage given by driving apparatus 100), gate voltage Vg saturates.

After the end of Miller period 200, the drain voltage is Vds=0, and therefore, the switching power is again Psw=0. It is therefore understood that switching loss Lsw determined by integrating switching power Psw in the period from time ta to time tc is generated as the energy consumed by semiconductor device 10 in the turn-on operation.

The change of drain voltage Vds with time is a cause of electromagnetic noise generated by semiconductor device 10. As drain voltage Vds changes, displacement current flows through a parasitic capacitance located between drain 11 and a peripheral ground potential. Further, a change of the displacement current with time causes electromagnetic wave. The displacement current is proportional to the rate of change of the drain voltage, i.e., proportional to the time derivative value of the drain voltage. The magnitude of electromagnetic noise from semiconductor device 10 is proportional to the rate of change of the displacement current, i.e., the time derivative value of the displacement current. It is therefore understood that the magnitude of electromagnetic wave, i.e., the magnitude of electromagnetic noise, is proportional to the second order derivative value d2Vd ($d^2Vds/dt^2$) of the drain voltage with time.

As shown in FIG. 2, the absolute value of the second order derivative value d2Vd of the drain voltage which serves as an indicator of the magnitude of electromagnetic noise increases at time ta when drain voltage Vds starts decreasing in response to gate voltage Vg exceeding threshold voltage Vth, and increases at time tc when the turn-on operation ends (i.e., the timing when the Miller period ends). Second order derivative value d2Vd causes electromagnetic noise, regardless of whether the second order derivative value is positive or negative. As the absolute value of the second order derivative value is larger, the electromagnetic noise is larger. As seen from FIG. 2, the electromagnetic noise is particularly large at the end timing (time tc) of Miller period 200, and there is a need for reduction of this electromagnetic noise.

Figure 3:
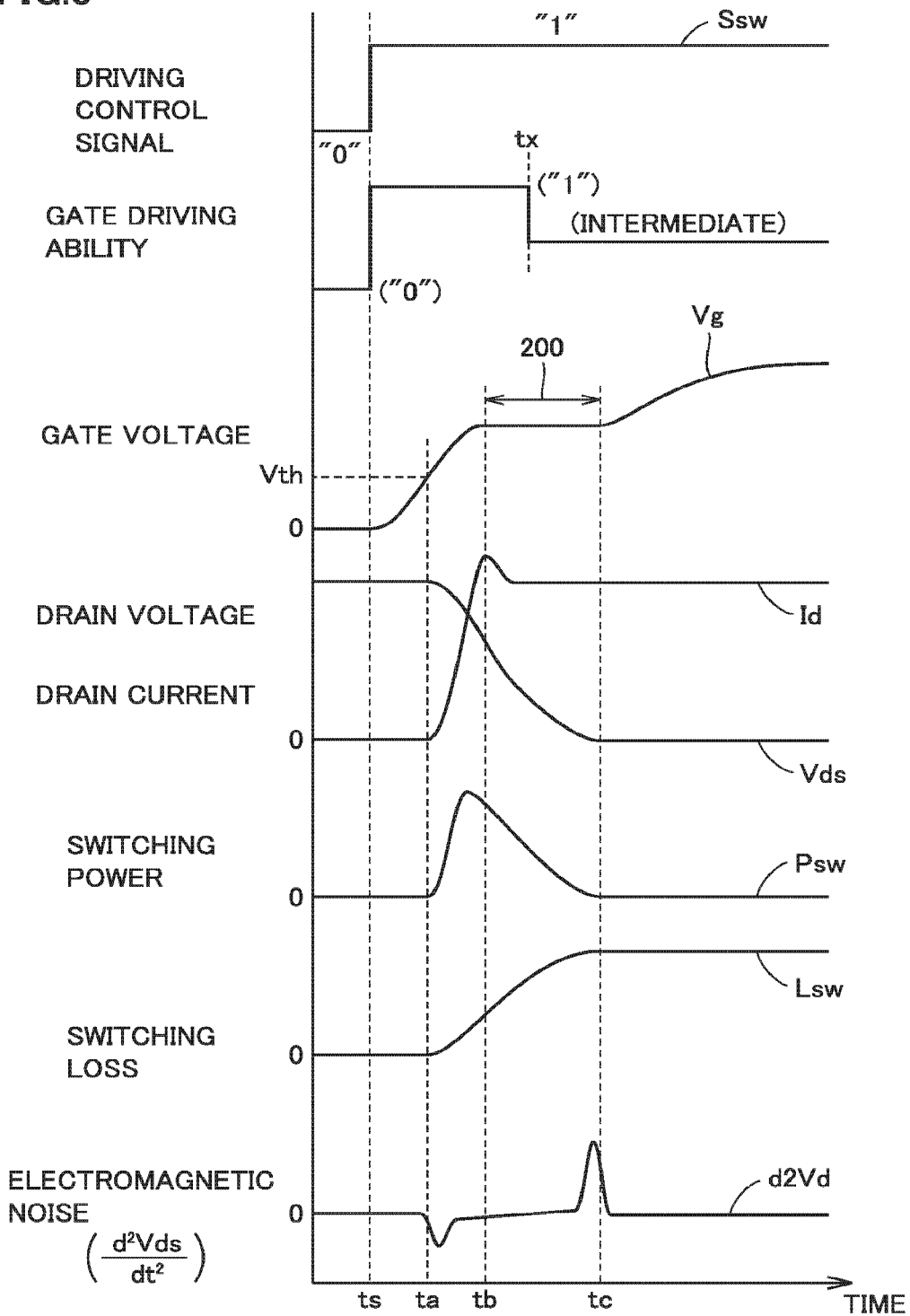
FIG. 3 is a waveform diagram for illustrating a general turn-on operation of a semiconductor device in accordance with a driving method presented as a comparative example.

As described above, PTL 1 and PTL 2 each disclose a technique for reducing the gate charging speed by lowering the gate driving ability from a certain time in the Miller period, in order to reduce electromagnetic noise at the end of the period. With reference to FIG. 3, a switching waveform in turn-on of a semiconductor device by the driving apparatus, including reduction of the driving ability in the Miller period, is shown as a comparative example.

With reference to FIG. 3 as compared with FIG. 2, a driving apparatus in the comparative example charges gate 15 with positive voltage Vh in response to change of driving control signal Ssw to "1" at time ts, similarly to FIG. 2. Accordingly, gate voltage Vg changes similarly to FIG. 2 and Miller period 200 starts.

In the comparative example, from predetermined time tx in Miller period 200, the gate driving ability is kept lower than that before time tx. Specifically, at time tx, the charging voltage for gate 15 is changed to a positive voltage lower than positive voltage Vh. Accordingly, charging current (gate current) supplied from the driving apparatus to gate 15 decreases and thereby the gate driving ability decreases. More specifically, in the turn-on operation in which the gate is charged, the gate driving ability is higher as the voltage connected to the gate by the driving apparatus is higher. On the contrary, in the turn-on operation in which the gate is discharged, the gate driving ability is higher as the voltage connected to the gate by the driving apparatus is lower.

In the period to time tx, respective behaviors of gate voltage Vg, drain current Id, drain voltage Vds, and switching power Psw are similar to those in FIG. 2. In contrast, after time tx, the gate driving ability is kept lower, and therefore, increase of gate voltage Vg is gentler as compared with the behavior in FIG. 2. Accordingly, respective changes of drain voltage Vds and drain current Id are also gentler. As a result, Miller period 200 is longer than that in FIG. 2. Specifically, the time length from time tb to time tc in FIG. 3 is longer than the time length from time tb to time tc in FIG. 2 (i.e., the length of the original Miller period). At the end timing (time tc) of Miller period 200, the absolute value of second order derivative value d2Vd of the drain voltage, i.e., the magnitude of electromagnetic noise, is reduced as compared with that at time tc in FIG. 2.

In the comparative example shown in FIG. 3, however, the length of time required from the start to the end of the turn-on of semiconductor device 10 (time length from time ts to time tc) is longer than that in FIG. 2. As a result, the period in which switching power Psw is generated is also longer, and therefore, switching loss Lsw represented by the integral of switching power Psw is larger than that in the usual turn-on operation in FIG. 2. In other words, the comparative example shown in FIG. 3 can reduce the electromagnetic noise, but involves a problem that the switching loss increases. As seen from the above, while it is difficult to achieve both reduction of the electromagnetic noise and reduction of the switching loss, the driving apparatus according to the present embodiment drives the gate of semiconductor device 10 so that the electromagnetic noise is reduced, without causing increase of the switching element, as compared with driving of the gate illustrated in FIG. 2.

The timing at which the Miller period starts and the length of the Miller period are basically determined depending on characteristics of semiconductor device 10. As described above in connection with the comparative example in FIG. 3, the gate driving ability which is kept low changes the timing at which the Miller period starts and the length of the Miller period. In the present embodiment in the following, for the gate voltage behavior which is exhibited when semiconductor device 10 is driven with a constant driving ability as shown in FIG. 2, the start timing and the end timing of the Miller period can be defined by time T1 elapsed from the start of driving (time ts) to time tb at which Miller period 200 starts, and time T2 elapsed from the start of driving (time ts) to time tc when Miller period 200 ends.

Time T2 can also be defined as a time elapsed from the start of driving (time ts) to the time when the drain voltage becomes Vds=0.

Figure 4:
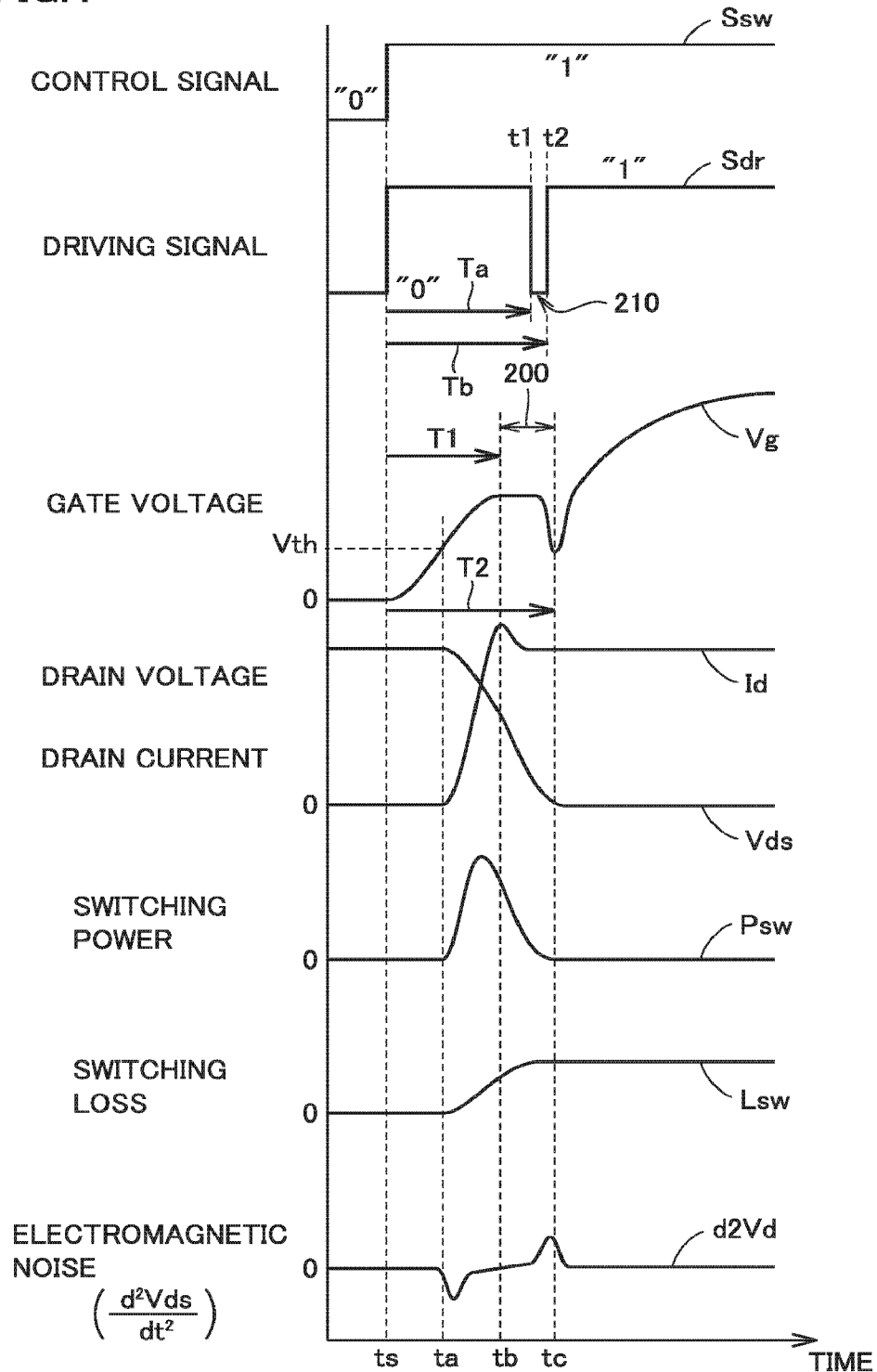
FIG. 4 is a waveform diagram illustrating an example turn-on operation of a semiconductor device implemented by a driving apparatus according to a first embodiment.

FIG. 4 is a waveform diagram illustrating an example turn-on operation of semiconductor device 10 implemented by a driving apparatus according to the first embodiment.

Referring to FIG. 4, in response to driving control signal Ssw changing to "1" at time ts similarly to FIG. 2, gate 15 is charged with positive voltage Vh. Accordingly, gate voltage Vg changes similarly to FIG. 2 and Miller period 200 starts.

Driving apparatus 100 according to the first embodiment reduces the gate driving ability at time t1 which is a predetermined time in Miller period 200, so that the gate driving ability is lower than that in the preceding period (time ts to time t1). The gate driving ability in the period before time t1 is equivalent to the gate driving ability in the period in which the driving control signal is Ssw="1" in FIG. 2.

After time t2, the gate driving ability is higher than that in the period from time t1 to time t2. Specifically, time t1 corresponds to "first time point" and time t2 corresponds to "second time point." The period from time ts to time t1 corresponds to "first period" and the period from time t1 to time t2 corresponds to "second period." In the following, the period from time t1 to time t2 is also referred to as reduction period 210.

Time t1 is set later than time ta (start timing of Miller period 200) at which time T1 has elapsed from time ts. Time t2 is set later than time t1, and determined as corresponding to time tc (end timing of Miller period 200) at which time T2 has elapsed from time ts. Preferably, time t2 is set immediately before time tc.

For example, gate 15 can be charged in accordance with driving signal Sdr set to "0" during the period from time t1 to time t2 which corresponds to reduction period 210 of the gate driving ability and occupies a part of the period in which the driving control signal is Ssw="1." After time t2, the gate driving ability is set higher. For example, the gate driving ability regains the level equivalent to the level before time t1.

Figure 5:
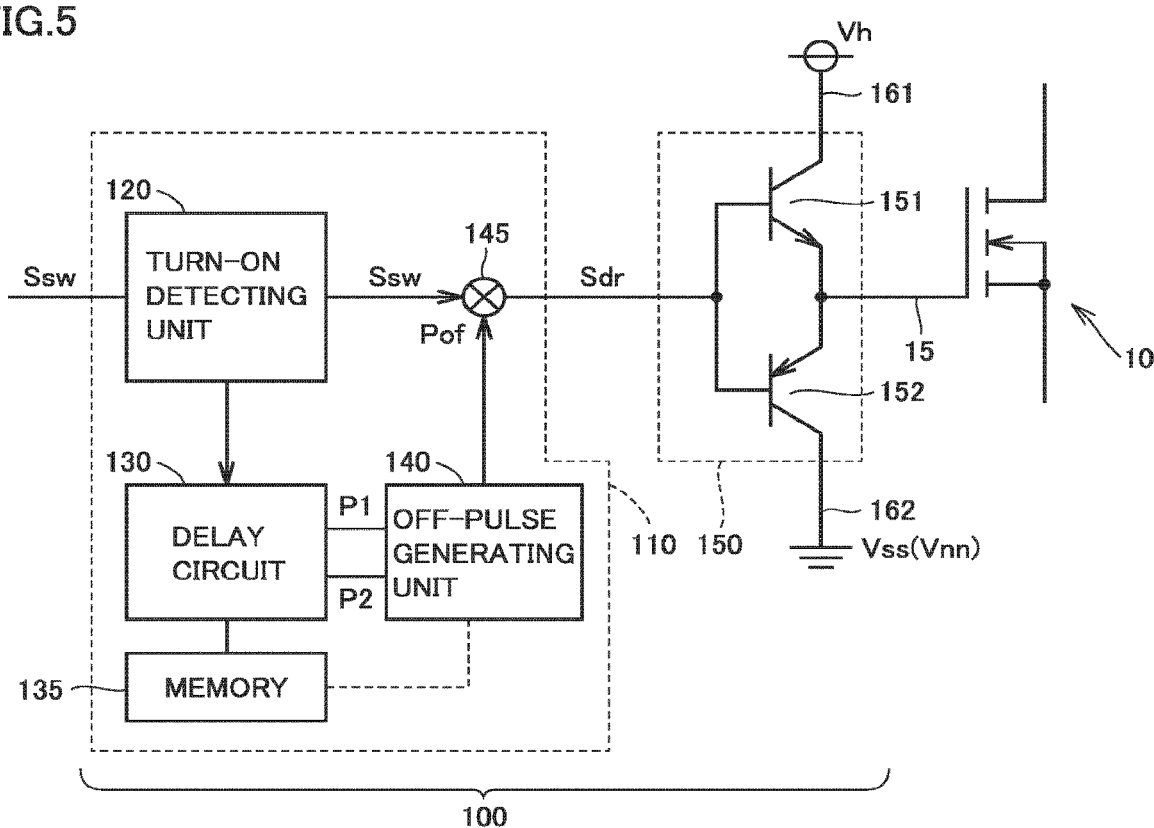
FIG. 5 shows a block diagram for illustrating a configuration of a driving apparatus 100 according to an embodiment.

FIG. 5 shows a block diagram for illustrating a configuration of driving apparatus 100 according to an embodiment.

Referring to FIG. 5, driving apparatus 100 includes a driving ability adjusting circuit 110 and a driving circuit 150.

Driving ability adjusting circuit 110 generates driving signal Sdr having reduction period 210 shown in FIG. 4, based on driving control signal Ssw. Driving ability adjusting circuit 110 includes a turn-on detecting unit 120, a delay circuit 130, a memory 135, an off-pulse generating unit 140, and a logical operation unit 145. Respective functions of the elements of driving ability adjusting circuit 110 may be implemented by a dedicated electronic circuit (hardware) or implemented by program processing (software). As is apparent from the following description, the function of "adjusting unit" can be implemented by driving ability adjusting circuit 110.

As driving control signal Ssw changes from "0" to "1," turn-on detecting unit 120 detects turn-on and generates one-shot pulse for delay circuit 130. The one-shot pulse from turn-on detecting unit 120 is input to delay circuit 130. Further, turn-on detecting unit 120 transmits driving control signal Ssw to logical operation unit 145.

In memory 135, data indicating time length Ta from time ts to time t1 when reduction period 210 starts, and time length Tb from time ts to time t2 when reduction period 210 ends is stored in advance. Based on the manner of driving the gate as shown in FIG. 2 as described above, namely based on the turn-on operation of semiconductor device 10 with the driving signal fixed at Sdr="1" after time ts, time length Ta and time length Tb can be set. More specifically, time length Ta and time length Tb are set to fall in the ranges specified by T1<Ta<Tb and Ta<Tb<T2, adapted to the characteristics of semiconductor device 10.

Delay circuit 130 generates first pulse P1 by delaying the one-shot pulse from turn-on detecting unit 120 by Ta, generates second pulse P2 by delaying the one-shot pulse from turn-on detecting unit 120 by Tb, and inputs pulses P1 and P2 to off-pulse generating unit 140.

Accordingly, off-pulse generating unit 140 can detect the start timing and the end timing of reduction period 210. Off-pulse generating unit 140 generates off-pulse signal Pof that is set to "0" during the period from reception of first pulse P1 to reception of the second pulse, and set to "1" during the other period.

Logical operation unit 145 generates driving signal Sdr by performing an AND operation of driving control signal Ssw and off-pulse signal Pof from off-pulse generating unit 140. In this way, driving signal Sdr is set to "0" during reduction period 210 shown in FIG. 4. In contrast, driving signal Sdr is set to "1" during the period in which driving control signal is Ssw="1" except for reduction period 210.

Driving circuit 150 includes a transistor 151 connected between a power supply node 161 and gate 15, and a transistor 152 connected between gate 15 and a power supply node 162. Power supply node 161 supplies positive voltage Vh for charging gate 15. Power supply node 162 supplies voltage Vss of the same potential as the source, or negative voltage Vnn with respect to the source, for turning off semiconductor device 10. Specifically, power supply node 161 corresponds to an embodiment of "first voltage terminal" and power supply node 162 corresponds to an embodiment of "second voltage terminal." One and the other of positive voltage Vh and voltage Vss (or negative voltage Vnn) correspond respectively to "first voltage" and "second voltage."

Transistors 151 and 152 have respective gates connected together to receive driving signal Sdr from driving ability adjusting circuit 110. In the period in which the driving signal is Sdr="1," transistor 151 is ON, transistor 152 is OFF, and gate 15 is connected to power supply node 161 supplying positive voltage Vh. Accordingly, gate 15 is charged.

In contrast, in the period in which the driving signal is Sdr="0," transistor 152 is ON, transistor 151 is OFF, and gate 15 is connected to power supply node 162 supplying Vss or negative voltage Vnn. It is therefore understood that charging of gate 15 is stopped during reduction period 210.

Referring again to FIG. 4, in response to the start of reduction period 210 in which driving signal Sdr is set to "0," gate voltage Vg decreases temporarily. In response to the end of reduction period 210, gate 15 is charged again with positive voltage Vh, and thus gate voltage Vg increases again.

Reduction period 210 is actually set to a considerably shorter period (on the order of 1/10 to 1/100 of the length of the Miller period, for example) relative to Miller period 200, so that the length of Miller period 200 remains the same as the Miller period for driving the gate in the manner illustrated in FIG. 2.

After time tc, switching power Psw is Psw=0 and therefore has a similar waveform to that in FIG. 2. Because Miller period 200 is not extended, switching loss Lsw can also be made substantially equivalent to that in FIG. 2.

Further, in a period prior to the end of Miller period 200 at which the drain voltage decreases to reach Vds=0, the gate driving ability is reduced to lessen charges supplied to gate 15. Accordingly, second order derivative value d2Vd of drain voltage Vds can be reduced. As a result, the electromagnetic noise can be reduced.

After the end of Miller period 200, increase of the Miller capacitance stops. It is therefore assumed that the following phenomenon will occur. Specifically, charges that have heretofore been supplied from driving apparatus 100 to the gate for charging the Miller capacitor may stray with no destination. It is therefore expected that the larger the number of charges that are affected by this phenomenon, drain voltage Vds changes more sharply and the absolute value of second order derivative value d2Vd increases.

In view of the above, driving apparatus 100 in the present embodiment provides reduction period 210 immediately preceding the end of Miller period 200, to thereby reduce the gate driving ability temporarily. In this way, charges supplied to the gate are lessened at the timing when increase of the Miller capacitance stops. As a result, drain voltage Vds changes gradually and the absolute value of second order derivative value d2Vd is reduced. It is therefore possible to reduce the electromagnetic noise generated before and after time tc, as shown in FIG. 4.

Specifically, time t2 corresponding to the end timing of reduction period 210 is ideally located immediately before the end timing (time tc) of Miller period 200. It should be noted, however, the advantageous effect can be expected to some extent as long as time t2 is located in the vicinity of time tc. Therefore, time t2 can be determined as corresponding to the end timing (time tc) of Miller period 200.

Time t1 corresponding to the start timing of reduction period 210 can be determined from time t2 so that the length of reduction period 210 is an appropriate length. It is necessary to define the length of reduction period 210 so as not to cause the phenomenon that Miller period 200 is extended due to excessively long reduction period 210, like the comparative example in FIG. 3.

The start timing (time tb) and the end timing (time tc) of Miller period 200 can be determined in advance, based on Miller period 200 generated in the normal gate driving (FIG. 2) as described above, i.e., generated when the gate driving ability before time t1 in FIG. 4 is maintained and semiconductor device 10 is turned on. Specifically, the length of reduction period 210 can be determined to fall in a range that satisfies a condition that the drain voltage becomes Vds=0 at the end timing (time tc) of Miller period 200 in FIG. 2 at which T2 has elapsed from time ts, even when reduction period 210 is provided.

In particular, in the example in FIG. 4, the gate driving ability is reduced to a level that generates a period in which gate voltage Vg decreases in at least a part of reduction period 210. Thus, charges supplied to the gate are considerably lessened, and accordingly, the effect of reducing the electromagnetic noise is obtained easily even when reduction period 210 is shortened.

Because the behavior in the turn-on operation may vary depending on the characteristics of semiconductor device 10, the optimum values of the length and the timing of reduction period 210 may vary depending on the characteristics of semiconductor device 10. It is therefore possible to determine in advance the aforementioned optimum values adapted to the characteristics of semiconductor device 10, through tests and/or simulations conducted on an actual device. Ta and Tb corresponding to the determined optimum values can be stored in memory 135 (FIG. 5) to thereby provide reduction period 210 at a desired location.

As seen from the above, with the driving apparatus according to the first embodiment, reduction period 210 in which the gate driving ability is reduced temporarily can be provided at a timing prior to the end of Miller period 200, to reduce the electromagnetic noise without increasing the switching loss, when semiconductor device 10 is turned on.

In particular, in the example configuration in FIG. 5, the reduction of the gate driving ability in reduction period 210 is accomplished by applying, to gate 15, a voltage (Vss, Vnn) for turning off semiconductor device 10. Specifically, in each of the period before time ts when driving of the gate is started (turn-off period of semiconductor device 10) and reduction period 210, gate 15 is connected to voltage Vss (or Vnn). In each of the period from time ts to time t1 and the period after time t2, gate 15 is connected to voltage Vh. In this way, driving apparatus 100 can be configured to only use the two different voltages, i.e., usual turn-on voltage Vh and turn-off voltage Vss (Vnn), to thereby avoid a complicated circuit configuration.

In other words, even when a voltage at a level between voltage Vh and voltage Vss (Vnn) is applied to gate 15 in reduction period 210, it is theoretically possible to reduce both the electromagnetic noise and the switching loss by recovering the gate driving ability after the end of reduction period 210. Such a configuration, however, may complicate the configuration of the driving apparatus including driving circuit 150 as described above.

In particular, in the example configuration in FIG. 5, if all the functions of driving ability adjusting circuit 110 are implemented by software, it is possible to configure "adjusting unit" as a part of the functions of control circuit 20 shown in FIG. 1. In this case, driving signal Sdr including off-pulse corresponding to reduction period 210 can be input directly from control circuit 20 to driving circuit 150 forming driving apparatus 100. In this case, driving signal Sdr and driving control signal Ssw can be distinguished from each other by comparing the number of times the signal level changes and the number of times semiconductor device 10 is actually turned on and off.

All the functions of driving ability adjusting circuit 110 can be implemented by software to thereby facilitate adjustment of the timing of the off-pulse (i.e., adjustment of time t1 and time t2) for implementing a desired on-off behavior. In contrast, in the case of hardware, driving circuit 150 can be designed so that solely high-speed turn-on and turn-off of the semiconductor device are accomplished. In this case, fine adjustments of the gate resistance for example are unnecessary and the design load can be reduced. In other words, with the hardware design facilitated, adjustments can be made by means of software to improve the performance relating to the switching loss and the electromagnetic noise.

Second Embodiment

In connection with a second embodiment, an example is described in which reduction period 210 of driving signal Sdr is divided into a plurality of periods.

Figure 6:
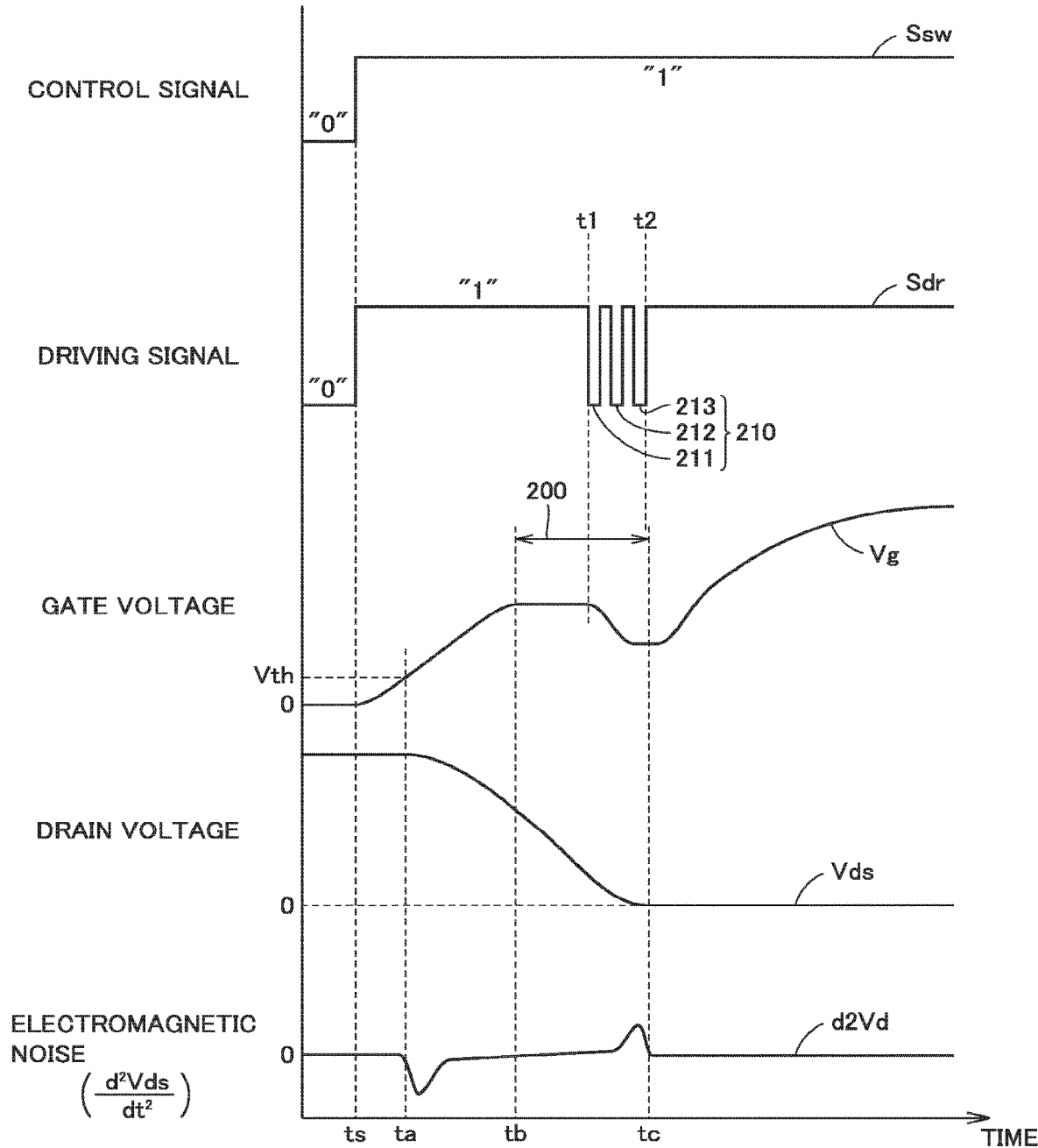
FIG. 6 is a waveform diagram illustrating an example turn-on operation of a semiconductor device implemented by a driving apparatus according to a second embodiment.

FIG. 6 is an operation waveform diagram for illustrating a turn-on operation implemented by driving apparatus 100 according to the second embodiment.

Referring to FIG. 6, driving apparatus 100 according to the second embodiment changes driving signal Sdr alternately to "0" and "1" in the period from time t1 to time t2 corresponding to reduction period 210. Thus, the period from time t1 to time t2 is divided into a plurality of reduction periods 211 to 213.

A plurality of reduction periods 211 to 213 can be generated by the division of the time to thereby adjust the amount of reduction of the gate driving ability, based on the time ratio of a "0" period relative to reduction period 210 in the first embodiment. In other words, the amount of reduction of the gate driving ability can be made variable even by the configuration in which only the two different voltages are applied to gate 15 as shown in FIG. 5.

For example, the timing for switching driving signal Sdr to "0" and "1" can be defined as a time elapsed from time t1 (start timing of reduction period 210), so that the reduction period is divided into a desired number of reduction periods 211 to 213 at a desired time ratio, and the elapsed time data can be stored in advance in memory 135. Off-pulse generating unit 140 uses the elapsed time data read from memory 135 to shape the off-pulse so that a plurality of reduction periods 211 to 213 are provided based on the elapsed time from time t1.

Figure 7:
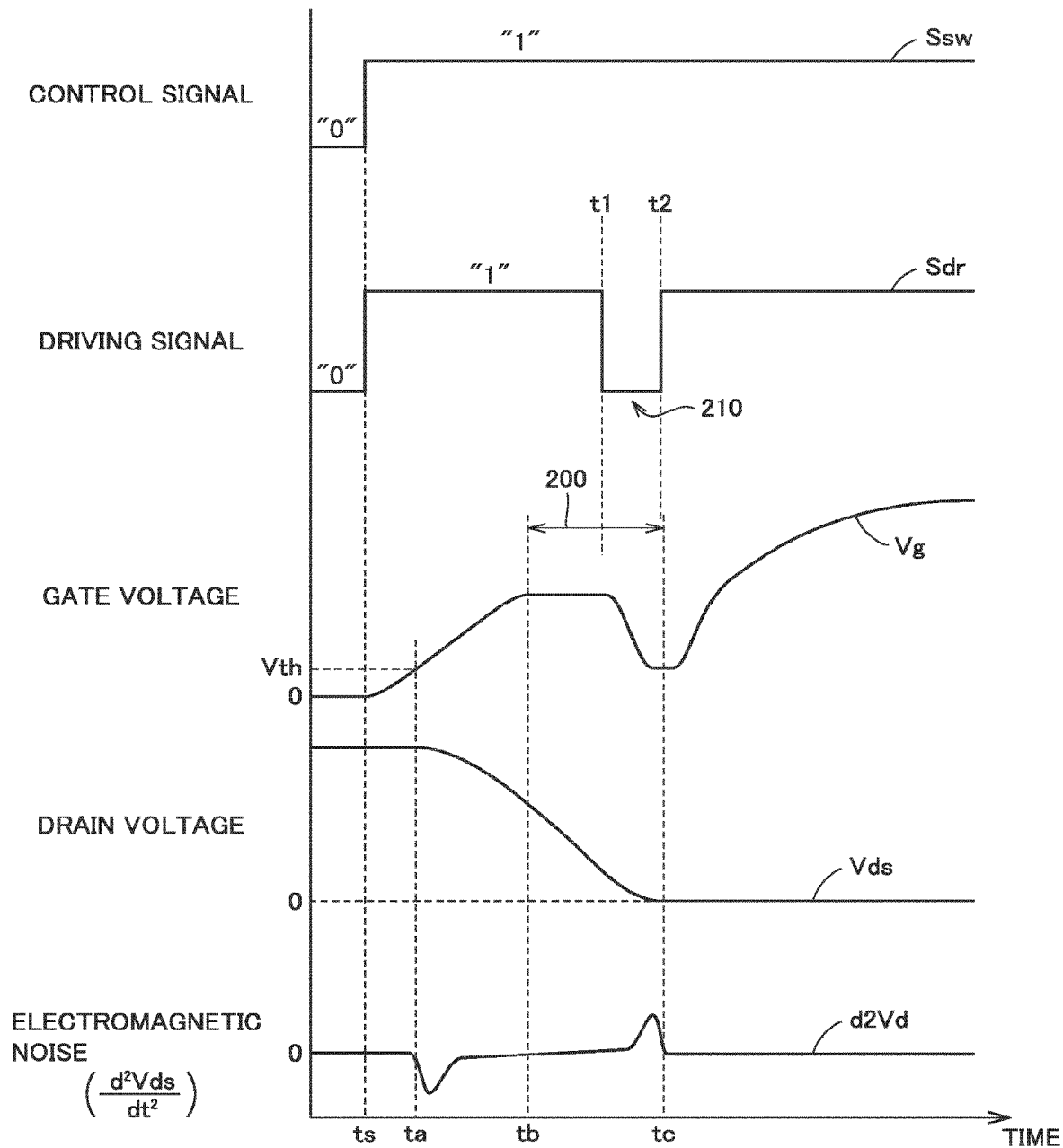
FIG. 7 is a waveform diagram illustrating, at the same scale as FIG. 6, an example turn-on operation of the semiconductor device implemented by the driving apparatus according to the first embodiment.

FIG. 7 shows a waveform diagram for the driving apparatus according to the first embodiment shown in FIG. 4, at the same scale as FIG. 6. In FIGS. 6 and 7, reduction period 210 is indicated at a larger ratio than the actual ratio relative to Miller period 200, for the sake of illustrating the division of the time.

Reduction period 210 in FIG. 6 has the same length as reduction period 210 in FIG. 7. In FIG. 7, driving signal Sdr is set to "0" and voltage Vss (Vnn) is applied to gate 15 during reduction period 210. In contrast, in FIG. 6, driving signal Sdr is set to "1" during a part of reduction period 210.

As a result, the amount of reduction of gate voltage Vg in reduction period 210 in FIG. 6 is smaller than the amount of reduction of gate voltage Vg in FIG. 7.

The turn-on behavior varies depending on the characteristics of semiconductor device 10. As the characteristics of semiconductor device 10 vary, the optimum value for the amount of reduction of the gate driving ability may vary, in addition to the length and the timing of reduction period 210.

With the driving apparatus according to the second embodiment, the amount of reduction of the gate driving ability in reduction period 210 in the first embodiment can be adjusted to be varied, with the configuration as shown in FIG. 5 in which only the two different voltages are applied to gate 15.

In this way, the electromagnetic noise can further be reduced in the manner adapted to the characteristics of semiconductor device 10. The amount of reduction of the gate driving ability adapted to the characteristics of semiconductor device 10, i.e., the parameter for dividing reduction period 210, can be determined in advance through tests and/or simulations conducted on an actual device.

Modification of Second Embodiment

Figure 8:
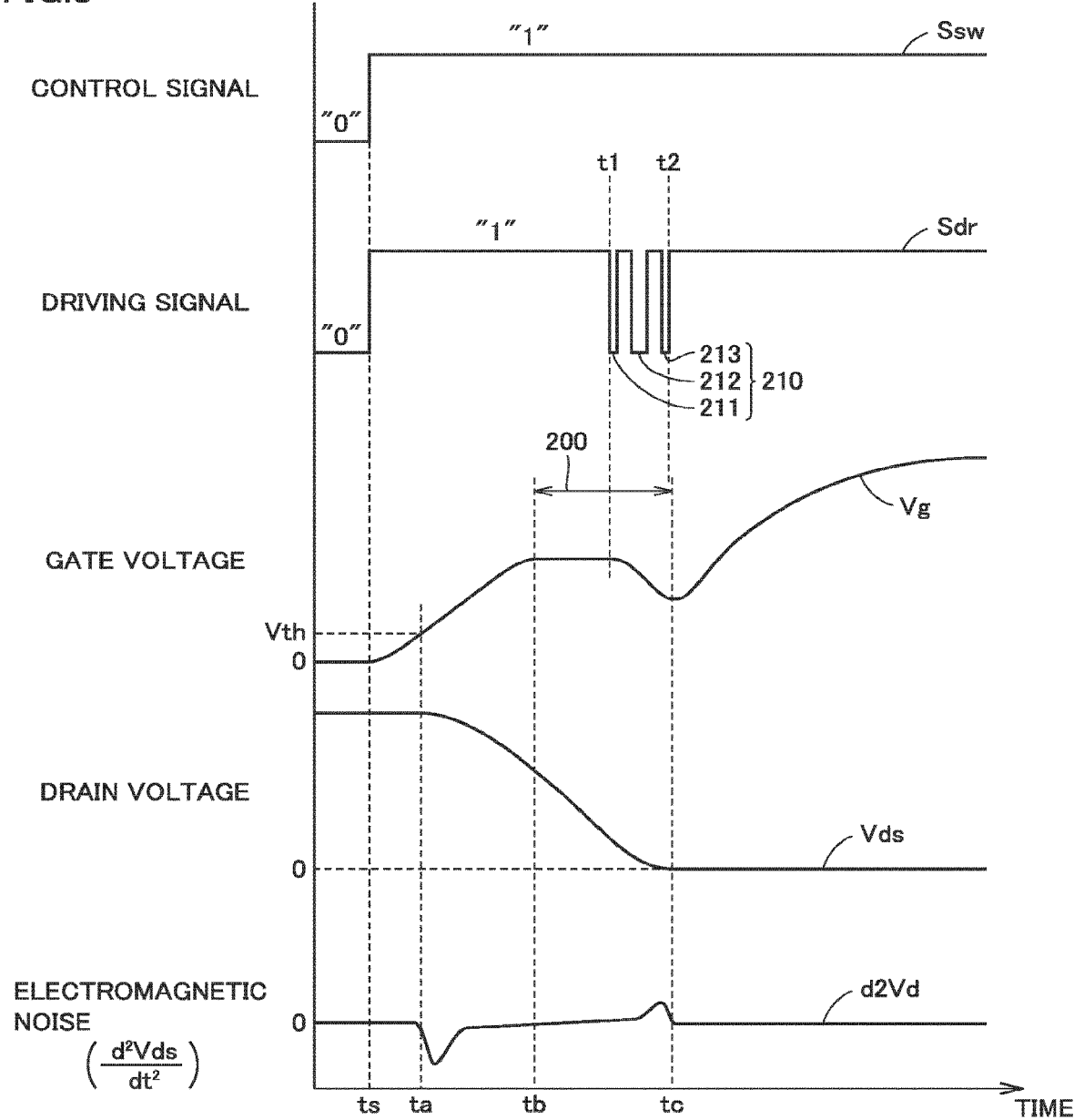
FIG. 8 is a waveform diagram illustrating an example turn-on operation of a semiconductor device implemented by a driving apparatus according to a modification of the second embodiment.

FIG. 8 is a waveform diagram illustrating an example turn-on operation of a semiconductor device implemented by a driving apparatus according to a modification of the second embodiment. Like FIGS. 6 and 7, reduction period 210 in FIG. 8 is shown to be longer than the actual ratio relative to Miller period 200.

Referring to FIG. 8, the modification of the second embodiment differs from FIG. 6 (second embodiment) in that the former divides reduction period 210 into a plurality of reduction periods 211 to 213 of different lengths.

Specifically, respective durations of reduction periods 211 to 213 are adjusted so that endmost reduction periods 211, 213 are shorter than central reduction period 212. In other words, respective durations of a plurality of reduction periods are set so that the reduction period closer to time t1 or time t2 is shorter.

In this way, finer adjustments can be made to the amount of reduction of the gate driving ability in reduction period 210. In other words, in addition to the time ratio of the length of the "0" period to the length of reduction period 210, the timing at which the gate driving ability is reduced can be adjusted finely. As a result, the electromagnetic noise can be reduced in the manner further adapted to the characteristics of semiconductor device 10.

The first embodiment as well as the second embodiment and its modification illustrate the example operation waveform in the turn-on operation of semiconductor device 10. In the turn-off operation of semiconductor device 10 as well, the level of driving control signal Ssw and the level of driving signal Sdr can be switched between "0" and "1" to perform the turn-off operation with reduced electromagnetic noise, without increasing the switching loss. In the turn-off operation of semiconductor device 10, the drain voltage becomes Vds=Vdd−Vss at time tc when Miller period 200 ends and accordingly disconnection of the main electrodes (drain and source) of semiconductor device 10 is completed.

In the second embodiment and its modification as well, all the functions of driving ability adjusting circuit 110 can be implemented by software to thereby facilitate complicated adjustment of the off-pulse.

Third Embodiment

In connection with a third embodiment, a description is given of an example configuration of a power conversion apparatus to which the semiconductor device driving apparatus according to the first embodiment as well as the second embodiment ant its modification is applied.

Figure 9:
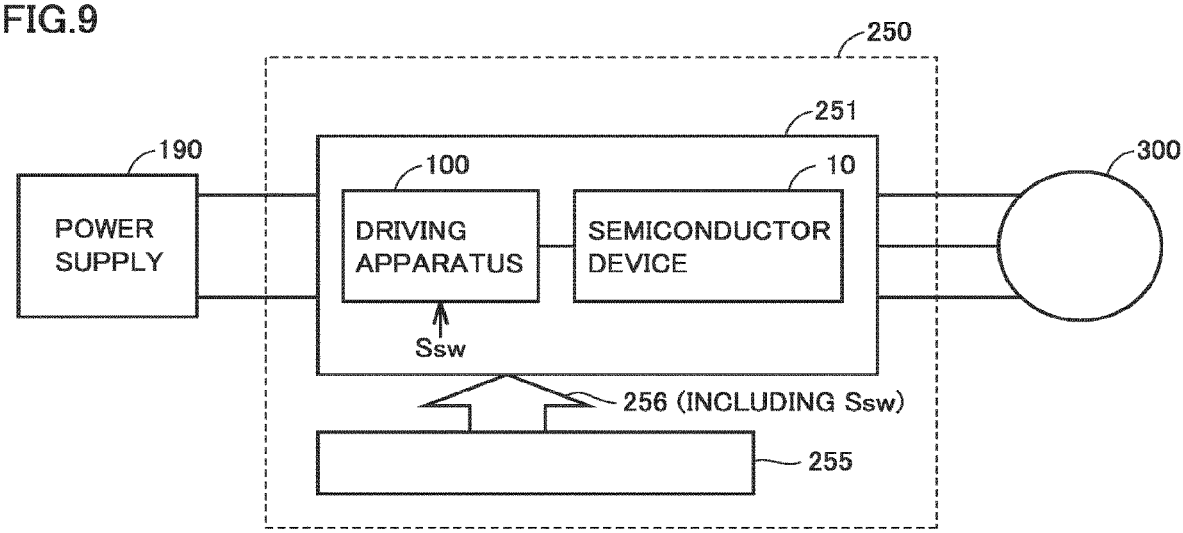
FIG. 9 is a block diagram showing a configuration of a power conversion system to which a power conversion apparatus is applied according to a third embodiment.

FIG. 9 is a block diagram showing a configuration of a power conversion system to which a power conversion apparatus of the third embodiment is applied.

Referring to FIG. 9, the power conversion system includes a power supply 190, a power conversion apparatus 250, and a load 300. Power supply 190 is a DC power supply for supplying DC power to power conversion apparatus 250. Power supply 190 may be configured as any of a variety of power supplies, such as DC supply system, solar battery, and storage battery. Alternatively, power supply 190 may be configured as a rectifier circuit or AC/DC converter connected to an AC supply system. Further, power supply 190 may be configured as a DC/DC converter for converting DC power output from a DC supply system into predetermined power.

Load 300 is typically a three-phase electric motor driven by AC power supplied from power conversion apparatus 250. Load 300 is not limited to a particular use, but may be an electric motor mounted in any of a variety of electrical devices, and used for example as an electric motor for a hybrid vehicle, electric vehicle, railroad vehicle, elevator, or air conditioner.

Power conversion apparatus 250 is for example a three-phase inverter connected between power supply 190 and load 300, for converting DC power supplied from power supply 190 into AC power and supplying the AC power to load 300.

Power conversion apparatus 250 includes a main conversion circuit 251 that converts DC power into AC power and outputs the AC power, and a control circuit 255 that outputs, to main conversion circuit 251, a control signal 256 controlling main conversion circuit 251.

Main conversion circuit 251 includes at least one semiconductor device 10 and a driving apparatus 100 arranged to be associated with a respective semiconductor device 10. Control signal 256 from control circuit 255 includes driving control signal Ssw for controlling turn-on and turn-off of semiconductor device 10. Each semiconductor device 10 is turned on and off in accordance with respective driving control signal Ssw, and accordingly main conversion circuit 251 converts DC power supplied from power supply 190 into AC power and supplies the AC power to load 300.

The specific circuit configuration of main conversion circuit 251 may be any of a variety of circuit configurations. For example, main conversion circuit 251 may be a two-level three-phase full-bridge circuit constituted of six semiconductor devices 10 and six freewheeling diodes connected in anti-parallel with semiconductor devices 10.

Of these six semiconductor devices 10, every two semiconductor devices 10 are connected in series to serve as an upper arm and a lower arm, respectively. Each pair of the upper arm and the lower arm constitutes a respective phase (U phase, V phase, W phase) of the full-bridge circuit. Respective output terminals of the upper-lower arms, i.e., three output terminals of main conversion circuit 251 are connected to load 300.

Control circuit 255 controls turn-on and turn-off of semiconductor devices 10 in main conversion circuit 251 so that desired power is supplied to load 300. Specifically, control circuit 255 calculates the time (ON time) for which each semiconductor device 10 in main conversion circuit 251 should be in the ON state, based on power to be supplied to load 300. For example, in accordance with the PWM control for changing the ON time of each semiconductor device 10 based on the voltage to be output, main conversion circuit 251 can be controlled.

At a respective point of time, control circuit 255 sets, to "1", driving control signal Ssw for semiconductor device 10 to be switched into the ON state, and sets, to "0", driving control signal Ssw for semiconductor device 10 to be switched into the OFF state.

Driving apparatus 100 controls the gate voltage of its associated semiconductor device 10 in accordance with driving control signal Ssw from control circuit 255. Driving apparatus 100 is configured in accordance with the first embodiment as well as the second embodiment and its modification. Accordingly, the switching loss and the electromagnetic noise of each semiconductor device 10 can be reduced and therefore, for power conversion apparatus 250 as well, increased efficiency of power conversion by reducing the switching loss and reduction of the electromagnetic noise which accompanies power conversion can be achieved.

Driving apparatus 100 may be included in a semiconductor module (not shown) in which semiconductor device 10 is included, or may be connected externally to the semiconductor module.

In the present embodiment, the two-level three-phase inverter is described above as an example of power conversion apparatus 250. Driving apparatus 100 described in connection with the present embodiment is applicable to a variety of power conversion apparatuses in addition to the one illustrated herein. For example, power conversion apparatus 250 may be a three-level or multi-level power conversion apparatus. In the case where load 300 is a single-phase AC load, power conversion apparatus 250 may be configured as a single-phase inverter. In the case where load 300 is a DC load, power conversion apparatus 250 may be configured as a DC/DC converter or AC/DC converter.

Thus, for any power conversion apparatus for performing power conversion by controlling turn-on and turn-off of a semiconductor device, driving apparatus 100 according to the first embodiment, the second embodiments and its modification can be applied to turn on and turn off semiconductor device 10.

In the third embodiment as well, all the functions of driving ability adjusting circuit 110 of driving apparatus 100 can be implemented by software. Specifically, as a part of the functions of control circuit 255, "adjusting unit" may be implemented. In this case, control signal 256 from control circuit 255 may include driving signal Sdr including an off-pulse corresponding to reduction period 210. In this case as well, driving signal Sdr and driving control signal Ssw can be distinguished from each other by the number of times the signal level is changed and the number of times semiconductor device 10 is actually turned on and off.

Moreover, the power conversion apparatus according to the present embodiment is not limited to the case where the aforementioned load is an electric motor. For example, the power conversion apparatus can be used as a power supply apparatus for an electrical discharge machining device or laser beam machining device, or an induction heater for cooking or non-contact power feeding system, and also can be used as a power conditioner for a photovoltaic power generation system or power storage system, for example.

It should be construed that the embodiments disclosed herein are given by way of illustration in all respects, not by way of limitation. It is intended that the scope of the present invention is defined by claims, not by the description above, and encompasses all modifications and variations equivalent in meaning and scope to the claims.

REFERENCE SIGNS LIST 10 semiconductor device; 11 drain; 12 source; 15 gate; 20, 255 control circuit; 100 driving apparatus; 110 driving ability adjusting circuit; 120 turn-on detecting unit; 130 delay circuit; 135 memory; 140 off-pulse generating unit; 145 logical operation unit; 150 driving circuit; 151, 152 transistor; 161, 162 power supply node; 190 power supply; 200 Miller period; 210, 211-213 reduction period; 250 power conversion apparatus; 251 main conversion circuit; 256 control signal; 300 load; Id drain current; Lsw switching loss; N1 high voltage terminal; N2 low voltage terminal; Pof off-pulse signal; Psw switching power; Sdr driving signal; Ssw driving control signal; Vds drain voltage; Vg gate voltage; Vh positive voltage; Vnn negative voltage; Vss source voltage; Vth threshold voltage (semiconductor device); d2Vd second-order derivative value (drain voltage)

The invention claimed is:

1. A semiconductor device driving method for turning on and off a semiconductor device in accordance with a driving control signal, the method comprising:
setting a driving ability constant during a first period from a start of driving the gate to the first time point after a start of a Miller period of a gate voltage in driving a gate of the semiconductor device in accordance with the driving control signal;
making, at the first time point, the driving ability lower than the driving ability during the first period; and
making, at a second time point corresponding to an end of the Miller period, the driving ability higher than the driving ability during a second period from the first time point to the second time point in the Miller period, wherein the second period is shorter than the first period.

2. The semiconductor device driving method according to claim 1, wherein
the driving ability during the first period is equivalent to the driving ability after the second period, and
the gate voltage decreases in at least a part of the second period, in turning on the semiconductor device.

3. The semiconductor device driving method according to claim 1, wherein the second period has a length in a range from 1/10 to 1/100 of a length of the Miller period.

4. The semiconductor device driving method according to claim 1, wherein
the gate is connected to a first voltage during each of the first period and a period from the second time point to a subsequent start of driving the gate, and
the gate is connected to a second voltage before a present start of driving the gate and during the second period.

5. The semiconductor device driving apparatus method to claim 1, wherein the driving ability is set to a first level during the first period and a period after the second time point in turning on the semiconductor device, and maintained at the second level during the second period.

6. A semiconductor device driving apparatus for turning on and off a semiconductor device, the semiconductor device driving apparatus comprising:
a driving circuit configured to drive a gate of the semiconductor device in accordance with a driving control signal controlling turn-on and turn-off of the semiconductor device; and
processing circuitry configured to adjust a driving ability of the driving circuit,
the processing circuitry being configured to
set a driving ability constant during a first period from a start of driving the gate to the first time point after a start of a Miller period of a gate voltage in driving a gate of the semiconductor device in accordance with the driving control signal;
make, at the first time point, the driving ability for the gate lower than the driving ability during the first period from a start of driving the gate to the first time point, and
make, at a second time point corresponding to an end of the Miller period, the driving ability higher than the driving ability during a second period from the first time point to the second time point in the Miller period,
wherein the second period is shorter than the first period.

7. The semiconductor device driving apparatus according to claim 6, wherein the processing circuitry is configured to divide the second period into a plurality of reduction periods during which the driving ability is set lower than the driving ability during the first period, and configured to make the driving ability after the second time point higher than the driving ability during the reduction periods.

8. The semiconductor device driving apparatus according to claim 6, wherein
the driving control signal is set to a first level during a period in which the semiconductor device is to be ON, and set to a second level during a period in which the semiconductor device is to be OFF,
the processing circuitry is configured to generate a driving signal having the first level and the second level in accordance with the driving control signal,
the driving circuit is configured to electrically connect the gate to a first voltage terminal when the driving signal has the first level, and electrically connect the gate to a second voltage terminal supplying a voltage lower than the first voltage terminal, when the driving signal has the second level, and
the processing circuitry is configured to set the driving signal to the first level during the first period in turning on the semiconductor device, set the driving signal to the second level in at least a part of the second period, and set the driving signal to the first level after the second time point.

9. The semiconductor device driving apparatus according to claim 8, wherein the processing circuitry is configured to set the driving signal to the first level during the first period and a period after the second time point in turning on the semiconductor device, and maintain the driving signal at the second level during the second period.

10. The semiconductor device driving apparatus according to claim 8, wherein the processing circuitry is configured to set the driving signal to the first level during the first period and a period after the second time point in turning on the semiconductor device, divide the second period into a plurality of reduction periods during which the driving signal is set to the second level, and set the driving signal to the first level during the second period except for the reduction periods.

11. The semiconductor device driving apparatus according to claim 10, wherein respective durations of the plurality of reduction periods are determined so that the duration of a reduction period closer to the first or second time point is shorter.

12. A power conversion apparatus comprising:
a main conversion circuit including a driving apparatus according to claim 6, the main conversion circuit including at least one said semiconductor device, and being configured to convert input power and output the converted power, the driving apparatus being arranged to be associated with a respective semiconductor device of the at least one semiconductor device; and
a control circuit configured to output, to the main conversion circuit, a control signal controlling the main conversion circuit,
the driving apparatus being configured to control turn-on and turn-off of the associated semiconductor device in accordance with the control signal from the control circuit.

13. The semiconductor device driving apparatus according to claim 7, wherein respective durations of the plurality of reduction periods are determined so that the duration of a reduction period closer to the first or second time point is shorter.

14. The semiconductor device driving apparatus according to claim 6, wherein the second period has a length in a range from 1/10 to 1/100 of a length of the Miller period.

15. The semiconductor device driving apparatus according to claim 6, wherein the processing circuitry is configured to set the driving signal to a first level during the first period and a period after the second time point in turning on the semiconductor device, and maintain the driving signal at the second level during the second period.

* * * * *